US010359567B2

(12) United States Patent
Novack et al.

(10) Patent No.: US 10,359,567 B2
(45) Date of Patent: Jul. 23, 2019

(54) TEST SYSTEMS AND METHODS FOR CHIPS IN WAFER SCALE PHOTONIC SYSTEMS

(71) Applicant: Elenion Technologies, LLC, New York, NY (US)

(72) Inventors: Ari Novack, New York, NY (US); Matthew Akio Streshinsky, New York, NY (US); Michael J. Hochberg, New York, NY (US)

(73) Assignee: Elenion Technologies, LLC, New York, NY (US)

( * ) Notice: Subject to any disclaimer, the term of this patent is extended or adjusted under 35 U.S.C. 154(b) by 68 days.

(21) Appl. No.: 14/860,537

(22) Filed: Sep. 21, 2015

(65) Prior Publication Data
US 2017/0082799 A1    Mar. 23, 2017

(51) Int. Cl.
  *G02B 6/12*     (2006.01)
  *G02B 6/13*     (2006.01)
  *G01M 11/00*    (2006.01)
  *G02B 6/124*    (2006.01)
  *H01L 21/66*    (2006.01)
  *G01R 31/308*   (2006.01)

(52) U.S. Cl.
  CPC ........... *G02B 6/124* (2013.01); *G01R 31/308* (2013.01); *G02B 6/12* (2013.01); *G02B 6/13* (2013.01); *H01L 22/12* (2013.01); *G01M 11/30* (2013.01)

(58) Field of Classification Search
  CPC .......... H01L 22/12; G02B 6/124; G02B 6/13; G02B 6/12; G01R 31/308; G01M 11/30
  USPC ............................................ 257/776; 438/16
  See application file for complete search history.

(56) References Cited

U.S. PATENT DOCUMENTS

| 6,163,631 | A  | * | 12/2000 | Kawanishi | G02B 6/12004 372/50.1 |
| 7,043,109 | B2 | * | 5/2006  | Kish, Jr. | B82Y 20/00 356/237.4 |
| 7,200,308 | B2 |   | 4/2007  | Hochberg  |                       |

(Continued)

FOREIGN PATENT DOCUMENTS

JP    2014071318 A     4/2014
WO   WO 2010/113015 A1  10/2010

OTHER PUBLICATIONS

International Search Report, PCT/US2016/052684, dated Nov. 28, 2016 (6 pages).

(Continued)

*Primary Examiner* — Moshen Ahmadi
*Assistant Examiner* — Scott E Bauman
(74) *Attorney, Agent, or Firm* — Stratford Managers Corporation

(57) ABSTRACT

A qualification apparatus for a photonic chip on a wafer that leaves undisturbed an edge coupler that provides an operating port for the photonic devices or circuits on the chip during normal operation in order to not introduce extra loss in the optical path of the final circuit. The qualification apparatus provides an optical path that is angled with regard to the surface of the chip, for example by using a grating coupler. The qualification apparatus can be removed after the chip is qualified. Optionally, the qualification apparatus can be left in communication with the chip and optionally employed as an input port for the chip after the chip has been separated from other chips on a common substrate.

7 Claims, 9 Drawing Sheets

(56) References Cited

U.S. PATENT DOCUMENTS

| | | |
|---|---|---|
| 7,339,724 B2 | 3/2008 | Hochberg |
| 7,378,861 B1 | 5/2008 | Malendevich |
| 7,424,192 B2 | 9/2008 | Hochberg |
| 7,480,434 B2 | 1/2009 | Hochberg |
| 7,643,714 B2 | 1/2010 | Hochberg |
| 7,760,970 B2 | 7/2010 | Baehr-Jones |
| 7,894,696 B2 | 2/2011 | Baehr-Jones |
| 8,031,985 B2 | 10/2011 | Hochberg |
| 8,067,724 B2 | 11/2011 | Hochberg |
| 8,098,965 B1 | 1/2012 | Baehr-Jones |
| 8,203,115 B2 | 6/2012 | Hochberg |
| 8,237,102 B1 | 8/2012 | Baehr-Jones |
| 8,258,476 B1 | 9/2012 | Baehr-Jones |
| 8,270,778 B2 | 9/2012 | Hochberg |
| 8,280,211 B1 | 10/2012 | Baehr-Jones |
| 8,311,374 B2 | 11/2012 | Hochberg |
| 8,340,486 B1 | 12/2012 | Hochberg |
| 8,380,016 B1 | 2/2013 | Hochberg |
| 8,390,922 B1 | 3/2013 | Baehr-Jones |
| 8,625,942 B2 * | 1/2014 | Na .......................... G01M 11/00 385/14 |
| 8,798,406 B1 | 8/2014 | Hochberg |
| 8,818,141 B1 | 8/2014 | Hochberg |
| 9,459,177 B1 * | 10/2016 | Dong ..................... G01M 11/30 |
| 2005/0194990 A1 | 9/2005 | Gothoskar |
| 2012/0104389 A1 * | 5/2012 | Whitbread ............. G01M 11/00 257/48 |
| 2014/0043050 A1 * | 2/2014 | Stone ................. H04B 10/0731 324/750.01 |
| 2016/0109659 A1 * | 4/2016 | Jiang ..................... G02B 6/305 385/14 |
| 2016/0290891 A1 * | 10/2016 | Feng ....................... H01L 22/10 |

OTHER PUBLICATIONS

Written Opinion of the International Searching Authority, PCT/US2016/052684, dated Nov. 28, 2016 (5 pages).

\* cited by examiner

TEST SYSTEMS AND METHODS FOR CHIPS IN WAFER SCALE PHOTONIC SYSTEMS

FIELD OF THE INVENTION

The invention relates to systems and methods for testing semiconductor devices in general and particularly to systems and methods that provide systems and methods for qualification tests for devices present on uncut wafers.

BACKGROUND OF THE INVENTION

A significant expense in the production of optical devices is test during manufacture. The devices are fabricated on a single wafer and usually need to be diced into many separate chips that are then tested individually. When manipulating the chips individually there is the possibility of damaging the chip. Some packaging may also be needed, such as wire bonding or fiber attach, before testing can occur. Testing discrete chips that need processing before evaluating for failure is a costly process. A preferred method is to test each system on wafer before dicing the wafer into individual chips.

There is a need for improved systems and methods for qualifying photonic chips.

SUMMARY OF THE INVENTION

According to one aspect, the invention features a qualification apparatus for a photonic chip on a substrate, comprising: a wafer having constructed thereon at least one photonic chip, the photonic chip comprising a circuit having an operating port configured to be used during normal operation of the photonic chip, the photonic chip configured to be separated from the wafer; the wafer having constructed thereon a test port comprising a grating coupler in optical communication with the circuit, the grating coupler configured to interact with optical radiation that propagates at an angle to a free surface of the wafer, the grating coupler configured to be used during a qualification test of the photonic chip which is conducted prior to the photonic chip being separated from the wafer.

In one embodiment, the operating port comprises an edge coupler in optical communication with the circuit.

In another embodiment, the operating port comprises the grating coupler in optical communication with said circuit.

In another embodiment, the grating coupler in optical communication with the circuit is in optical communication with a second edge coupler by way of an optical waveguide, and the second edge coupler is in optical communication with the edge coupler of the photonic chip.

In yet another embodiment, the grating coupler is situated on a sacrificial region of the wafer, the sacrificial region configured to be mechanically separated from the photonic chip and discarded upon completion of the qualification test.

In still another embodiment, the grating coupler in optical communication with the circuit is in optical communication with the circuit by way of an optical waveguide and a directional coupler.

In a further embodiment, the grating coupler is situated on the photonic chip.

In yet a further embodiment, the grating coupler is configured to be removed upon completion of the qualification test.

In an additional embodiment, the grating coupler is configured to be placed onto an adjacent chip.

In one more embodiment, the grating coupler is configured to be removed upon completion of the qualification test.

According to another aspect, the invention relates to a method of manufacturing a qualification apparatus for a photonic chip on a substrate. The method comprises the steps of: fabricating on a substrate at least one photonic chip, the photonic chip comprising a circuit having an operating port configured to be used during normal operation of the photonic chip, the photonic chip configured to be separated from other photonic chips on the wafer; and fabricating on the wafer a test port comprising a grating coupler in optical communication with the circuit, the grating coupler configured to interact with optical radiation that propagates at an angle to a free surface of the wafer, the grating coupler configured to be used during a qualification test of the photonic chip which is conducted prior to the photonic chip being separated from other photonic chips on the wafer.

According to another aspect, the invention relates to a method of operating a qualification apparatus for a photonic chip on a substrate. The method comprises the steps of: providing a qualification apparatus for a photonic chip on a substrate, comprising: a photonic chip constructed on the wafer, the photonic chip comprising a circuit having an operating port configured to be used during normal operation of the photonic chip, the photonic chip configured to be separated from other photonic chips on the wafer; and a test port constructed on the wafer, the test port comprising a grating coupler in optical communication with the circuit, the grating coupler configured to interact with optical radiation that propagates at an angle to a free surface of the wafer, the grating coupler configured to be used during a qualification test of the photonic chip which is conducted prior to the photonic chip being separated from other photonic chips on the wafer; and applying an optical test signal to the test port, and providing the circuit in the photonic chip one or more required operating input signals; observing as a result a response signal from the circuit; and performing at least one of recording the result, transmitting the result to a data handling system, or to displaying the result to a user.

In one embodiment, the method of operating a qualification apparatus for a photonic chip further comprises the step of separating the photonic chip from other photonic chips on the wafer in the event that the response signal indicates that the photonic chip is acceptable.

In another embodiment, the method of operating a qualification apparatus for a photonic chip further comprises the step of removing the grating coupler upon completion of the qualification test.

In yet another embodiment, the method of operating a qualification apparatus for a photonic chip further comprises the step of placing the grating coupler onto an adjacent chip.

In still another embodiment, the method of operating a qualification apparatus for a photonic chip on a substrate further comprises the step of removing the grating coupler upon completion of the qualification test.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

Acronyms

Figure 1:
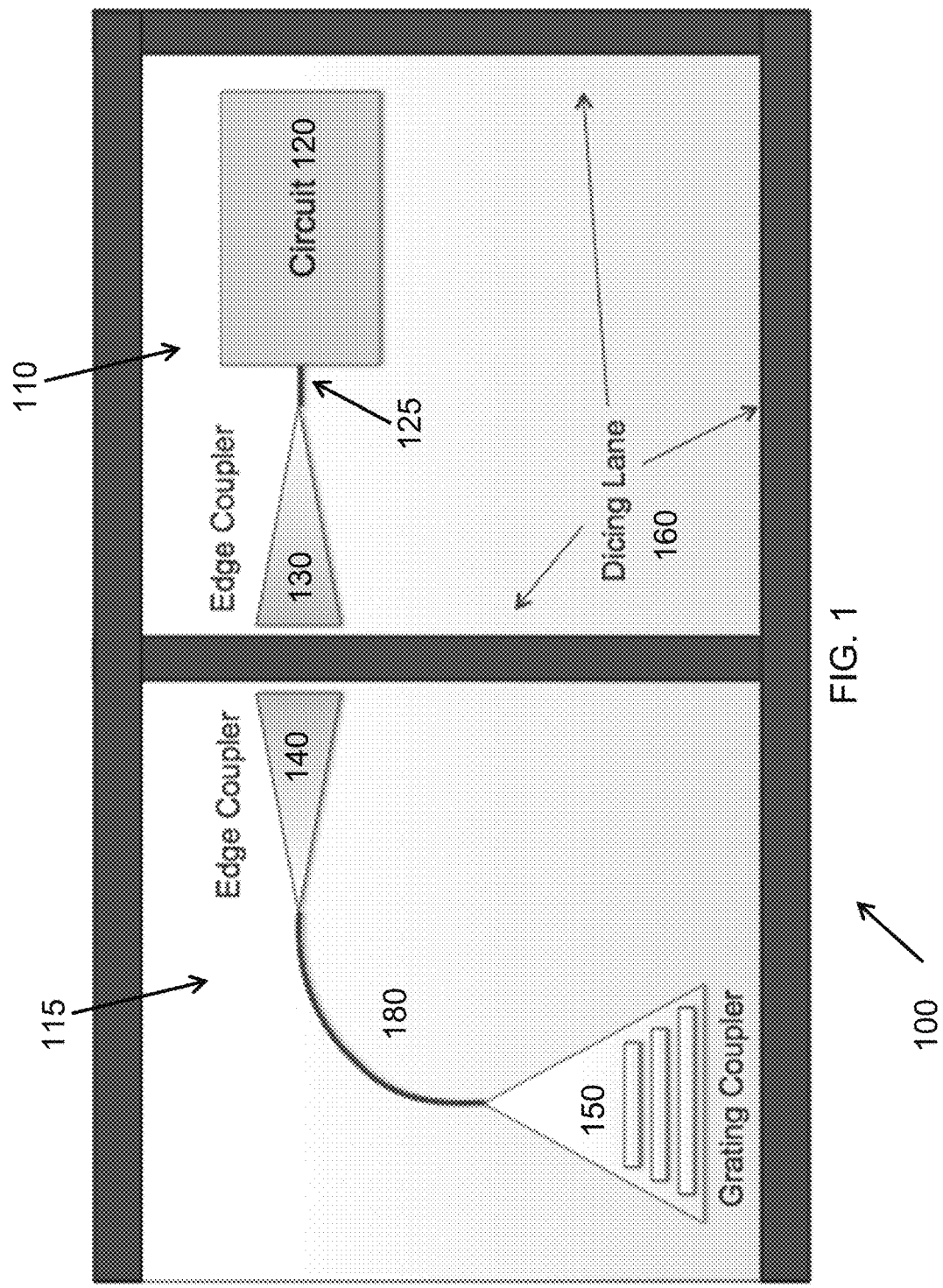
FIG. 1 is a drawing that illustrates one embodiment in which a chip having a circuit or a photonic device to be tested is present on a wafer.

A list of acronyms and their usual meanings in the present document (unless otherwise explicitly stated to denote a different thing) are presented below.

AMR Adabatic Micro-Ring
APD Avalanche Photodetector
ARM Anti-Reflection Microstructure
ASE Amplified Spontaneous Emission
BER Bit Error Rate
BOX Buried Oxide
CMOS Complementary Metal-Oxide-Semiconductor
CMP Chemical-Mechanical Planarization
DBR Distributed Bragg Reflector
DC (optics) Directional Coupler
DC (electronics) Direct Current
DCA Digital Communication Analyzer
DRC Design Rule Checking
DUT Device Under Test
ECL External Cavity Laser
FDTD Finite Difference Time Domain
FOM Figure of Merit
FSR Free Spectral Range
FWHM Full Width at Half Maximum
GaAs Gallium Arsenide
InP Indium Phosphide
LiNO$_3$ Lithium Niobate
LIV Light intensity (L)-Current (I)-Voltage (V)
MFD Mode Field Diameter
MPW Multi Project Wafer
NRZ Non-Return to Zero
PIC Photonic Integrated Circuits
PRBS Pseudo Random Bit Sequence
PDFA Praseodymium-Doped-Fiber-Amplifier
PSO Particle Swarm Optimization
Q Quality factor $$Q = 2\pi \times \frac{\text{Energy Stored}}{\text{Energy dissipated per cycle}} = 2\pi f_r \times \frac{\text{Energy Stored}}{\text{Power Loss}}.$$

QD Quantum Dot
RSOA Reflective Semiconductor Optical Amplifier
SOI Silicon on Insulator
SEM Scanning Electron Microscope
SMSR Single-Mode Suppression Ratio
TEC Thermal Electric Cooler
WDM Wavelength Division Multiplexing As used herein the term "substrate" is meant to include a silicon wafer, a silicon on insulator (SOI) wafer, a semiconductor wafer comprising material such as III-V compounds such as GaAs, InP and alloys of such III-V compounds, and wafers made of materials that are not semiconducting such as quartz and alumina.

We describe systems and methods for wafer scale qualification of photonic systems that would otherwise need to be diced and processed before component qualification can occur. In brief, the systems and methods of the invention allow one to measure every chip fabricated on the substrate, decide which chips are good (e.g., pass a qualification test) and which are bad (e.g., fail at least one element of a qualification test), mark the ones that are bad, separate the individual chips (for example by dicing), readily identify the bad chips after the chips are separated, and optionally throw the bad chips away or destroy them, while keeping the good chips. In some embodiments, an edge coupler is used to provide optical input and/or to receive optical output from photonic devices (or circuits) on a chip (e.g., to behave as an operating port for the photonic devices or circuits on the chip during normal operation). In order to not introduce extra loss, it is desirable to keep the optical path of the final circuit unchanged as compared to the optical path of a test circuit. In some embodiments, the optical test circuit remains on the completed chip and may optionally be used as an input port after the chip is fabricated and separated from the other chips on the substrate.

As illustrated in the embodiment shown in FIG. 1, a chip 110 having a circuit 120 or a photonic device 120 to be tested is present on a wafer 100. The chip 110 includes an edge coupler 130 that communicates with the circuit 120 by way of a waveguide 125.

As illustrated in the embodiment shown in FIG. 1, a second optical coupler can be used to provide an optical connection for testing the device (e.g., to provide a temporary optical port that allows the device to be tested, and which can subsequently be removed, masked off, or put into an unused state). As shown in the embodiment of FIG. 1, a sacrificial region 115 on the wafer 100 adjacent the chip 110 can be provided. In the sacrificial region 115 a second edge coupler 140 can be used to couple to the edge coupler 130 of the circuit 120 of interest. This second edge coupler 140 can then be connected to a grating coupler 150 by way of an optical waveguide 180 in order to provide an interface for light that couples out of the plane of the chip. Dicing lanes 160 are provided so that the chip 110 and the sacrificial region 115 can be cut out of the wafer 100 if the chip 110 is found to be acceptable after the test. The sacrificial region 115 may be separated from the chip 110 and discarded.

One advantage of using a grating coupler is that the test signal can be applied from a source that does not have to have its optical propagation direction in the plane of the chip. In addition, a resulting optical signal that may be generated by the circuit can be observed without having to place an optical sensor or receiver in the plane of the chip. For example, an optical test source (and/or an optical sensor or receiver) can be used that is oriented at an angle to a surface of the chip, and that can be rastered over the surface of the chip, so that individual grating couplers 150 present on the chip (for example, one grating couple per circuit fabricated on the chip) can each be accessed in a convenient manner, quickly, and at reduced expense. In this manner, a plurality of circuits on the chip can be tested without having to dice or saw the chip, and the location of each circuit and whether it passed or failed a given test can be logged.

In some embodiments, the sacrificial grating coupler chip includes an optical circuit useful in testing, such as a phase modulator to test a coherent mixer or a photodetector for alignment.

Figure 2:
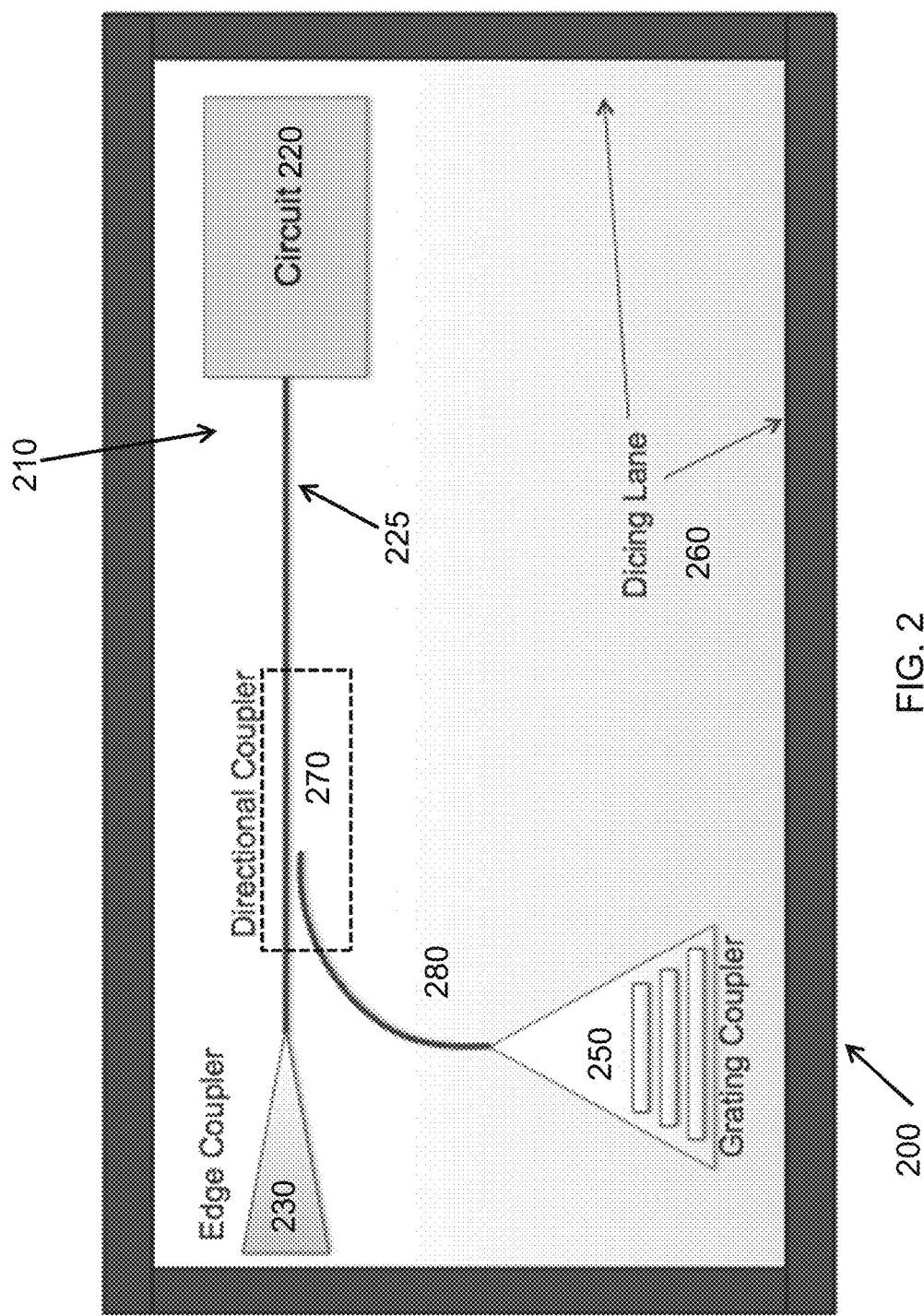
FIG. 2 is a drawing that illustrates another embodiment in which a chip having a circuit or a photonic device to be tested is present on a wafer.

As illustrated in another embodiment shown in FIG. 2, a wafer 200 has a chip 210 fabricated thereon. The chip 210 has not been cleaved or sawed from the wafer 200. The chip 210 is in optical communication with an edge coupler 230 by way of waveguide 225, which is the optical interface that is to be used with the chip 210 if the chip 210 passes the required tests and inspections, and is then cleaved or sawed out of the wafer 200.

As illustrated in the embodiment shown in FIG. 2, a test interface comprising a grating coupler 250 in optical communication with a directional coupler 270 by way of a waveguide 280 can be provided as a convenient optical connection to allow the circuit 210 to be tested. Once again, the grating coupler 250 provides the same advantages as are provided by the grating coupler 150 shown in FIG. 1.

In the embodiment of FIG. 2, wafer-scale test of edge coupled systems can be enabled by using a grating coupler 250 that is fed into the main optical path 225 using a directional coupler 270. As directional couplers are optically symmetric, a small tap is used so that little power is lost from the main optical circuit. A second tap can be used to measure an optical output of the circuit. Electrical outputs can be probed such that the electrical systems in the circuit can be tested in some way before dicing. After dicing and facet preparation, the testing structures are still present in the circuit, but provide minimal loss for the circuit operation.

After testing is completed, and depending on the method of facet fabrication, the testing interface (e.g., a grating coupler and/or a second edge coupler) can be removed in a variety of ways. If polishing is the approach used for facet preparation, the extra area or the test grating coupler 150, 250 can simply be polished away. If the facet is etched, the second set of edge couplers could exist on the other side of the etch trench, or the etch could proceed after circuit test. If the wafer is cleaved or sawed, the couplers could sit on opposite sides of the cleave (or saw) line. In some embodiments, such as illustrated in FIG. 2, the optical connection provided by the grating coupler 250 can simply be ignored if the chip on which the circuit 210 is fabricated is housed or used in such a way that the grating coupler 250 is masked off or otherwise is rendered optically inaccessible. In some alternative embodiments, the grating coupler 250 may be left in place without being masked off, but the waveguide 280 is cut or removed, so that the grating coupler 250 is no longer in optical communication with the directional coupler 270.

In the embodiment of FIG. 2, wafer-scale test of edge coupled systems can be enabled by using a grating coupler that is fed into the main optical path using a directional coupler. As directional couplers are optically symmetric, a small tap is used so that little power is lost from the main optical circuit. A second tap can be used to measure an optical output of the circuit. Electrical outputs can be probed such that most systems can be tested in some way before dicing. After dicing and facet preparation, the testing structures are still present in the circuit, but provide minimal loss for the circuit operation.

In some embodiments, the gap between the edge couplers can be in the range of 50 to 100 µm. Due to the significant distance, the edge couplers can be designed to have large mode fields to minimize the optical divergence to just a few degrees.

In a further embodiment, the etched facets are angled, so that one can deflect the optical beam of the edge coupler of the optical circuit in one direction or another. The second edge coupler can be designed to be higher or lower in the back end to match the location where the optical beam will hit. Further, the second edge couple may be configured such that the optical output propagates at an angle opposite the first edge coupler so that the two modes will overlap for minimal optical loss.

Figure 3:
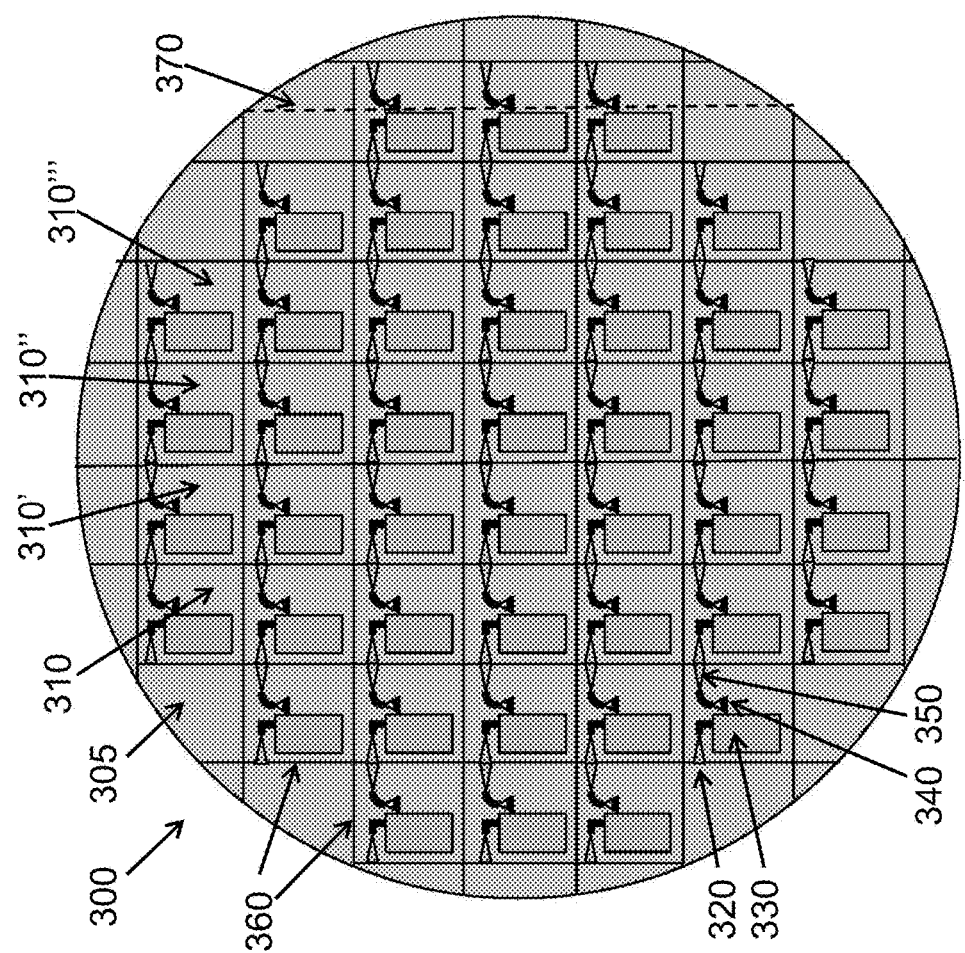
FIG. 3 is a diagram in plan view of a plurality of chips fabricated on a wafer.

FIG. 3 is a diagram in plan view of a plurality of chips 310, 310', 310'', 310''' fabricated on a wafer 300. In FIG. 3, each chip includes an edge coupler 320 connected by an optical waveguide to a circuit 320, and a grating coupler 340 connected to a second edge coupler 350. As should be apparent from the forgoing discussion, chip 310' can be tested using the grating coupler and the second edge coupler present on adjacent chip 310. For chips at the periphery of the wafer, additional grating couplers and second edge couplers (not shown) can be provided in areas that do not carry circuits, such as in area 305 to allow testing of the circuits present on chips that are at the periphery of the wafer 300. Dicing lanes 360 are illustrated to indicate how the chips may be separated from each other, with the test structures (the grating coupler and the second edge coupler) for the adjacent chip remaining after dicing. In another embodiment, a dicing lane 370 (shown in a dotted line) may be used to remove the test structures so that the diced chip includes only the first edge coupler and the circuit, but not the test structures for a chip that is no long present after dicing. During testing, the chips that pass the qualification test and the chips that fail the qualification test are differentiated, for example by marking the chips that have failed at least one element of the qualification test, so that they can be separated from the good chips after the dicing operation.

Figure 4:
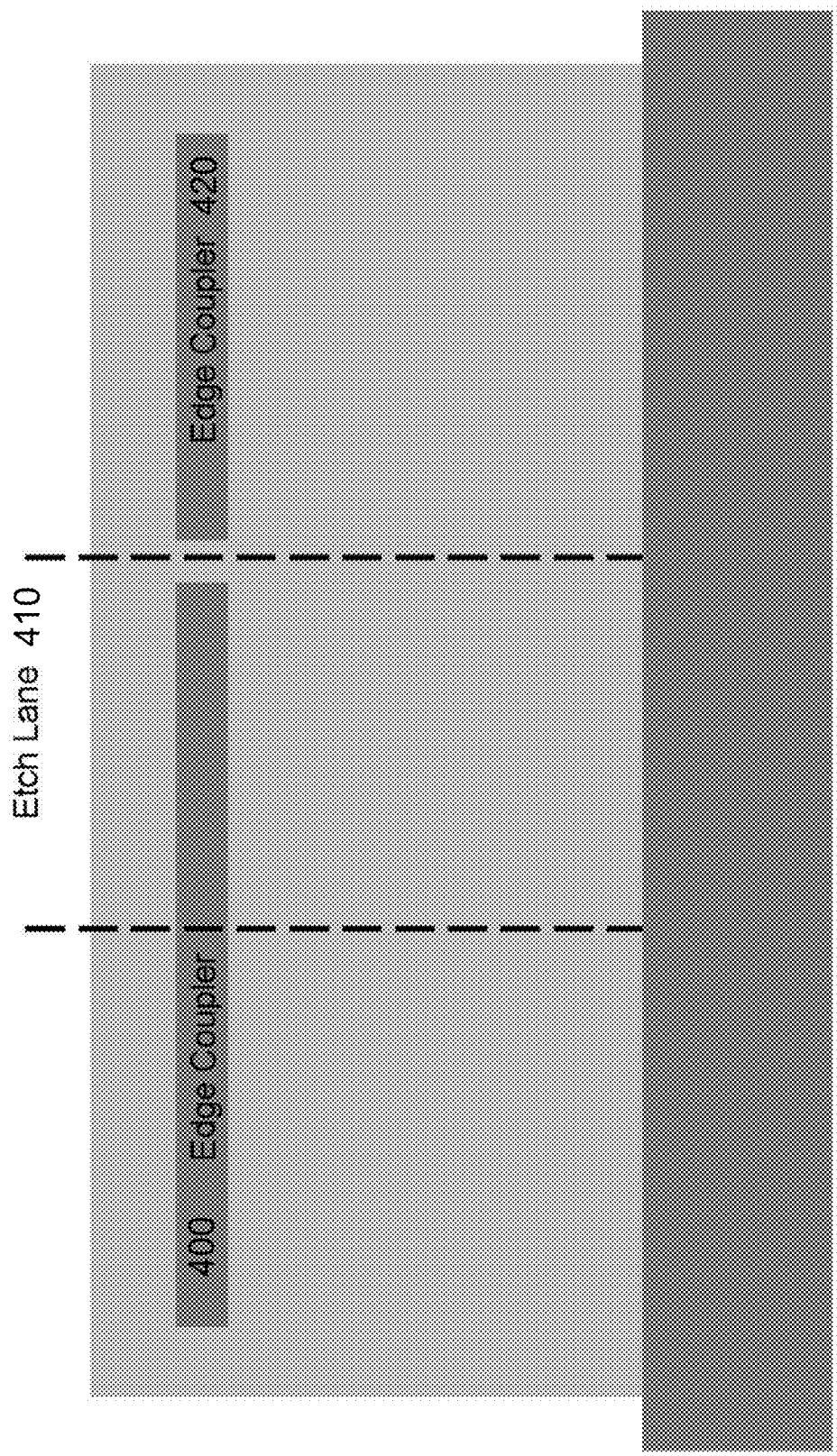
FIG. 4 is a first cross sectional view through a first embodiment of a wafer having a plurality of chips fabricated thereon.

FIG. 4 is a first cross sectional view through a first embodiment of a wafer having a plurality of chips fabricated thereon. As shown in FIG. 4 an edge coupler 400 that is part of the test structure and an edge coupler 420 that is connected to a circuit are present. A region 410 that can be used to etch to separate chips on a wafer, or that can be a dicing lane, is illustrated. The test edge coupler 400 is constructed so that it is quite close to the edge coupler 420 during testing so that optical communication between edge coupler 400 and edge coupler 420 will be good. However, during etching or dicing for separating chips, some of edge coupler 400 will be lost, while none of edge couple 420 will be removed or damaged.

Figure 5:
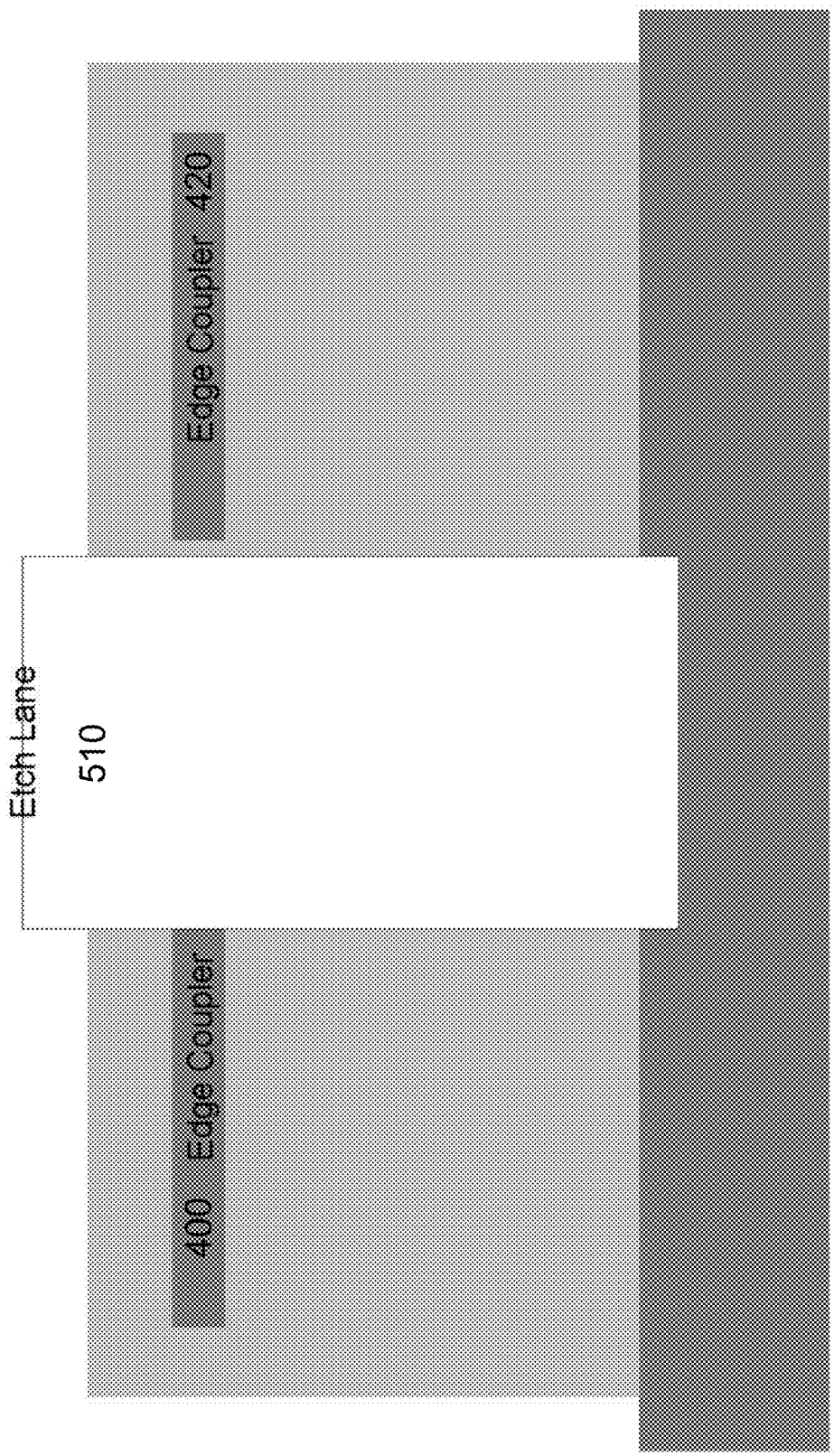
FIG. 5 is a second cross sectional view through a first embodiment of a wafer having a plurality of chips fabricated thereon.

FIG. 5 is a second cross sectional view through a first embodiment of a wafer having a plurality of chips fabricated thereon. In FIG. 5, which is a diagram similar to FIG. 4 but after etching has occurred, one sees that part of edge coupler 400 is gone, but the edge coupler 420 is intact.

Figure 6:
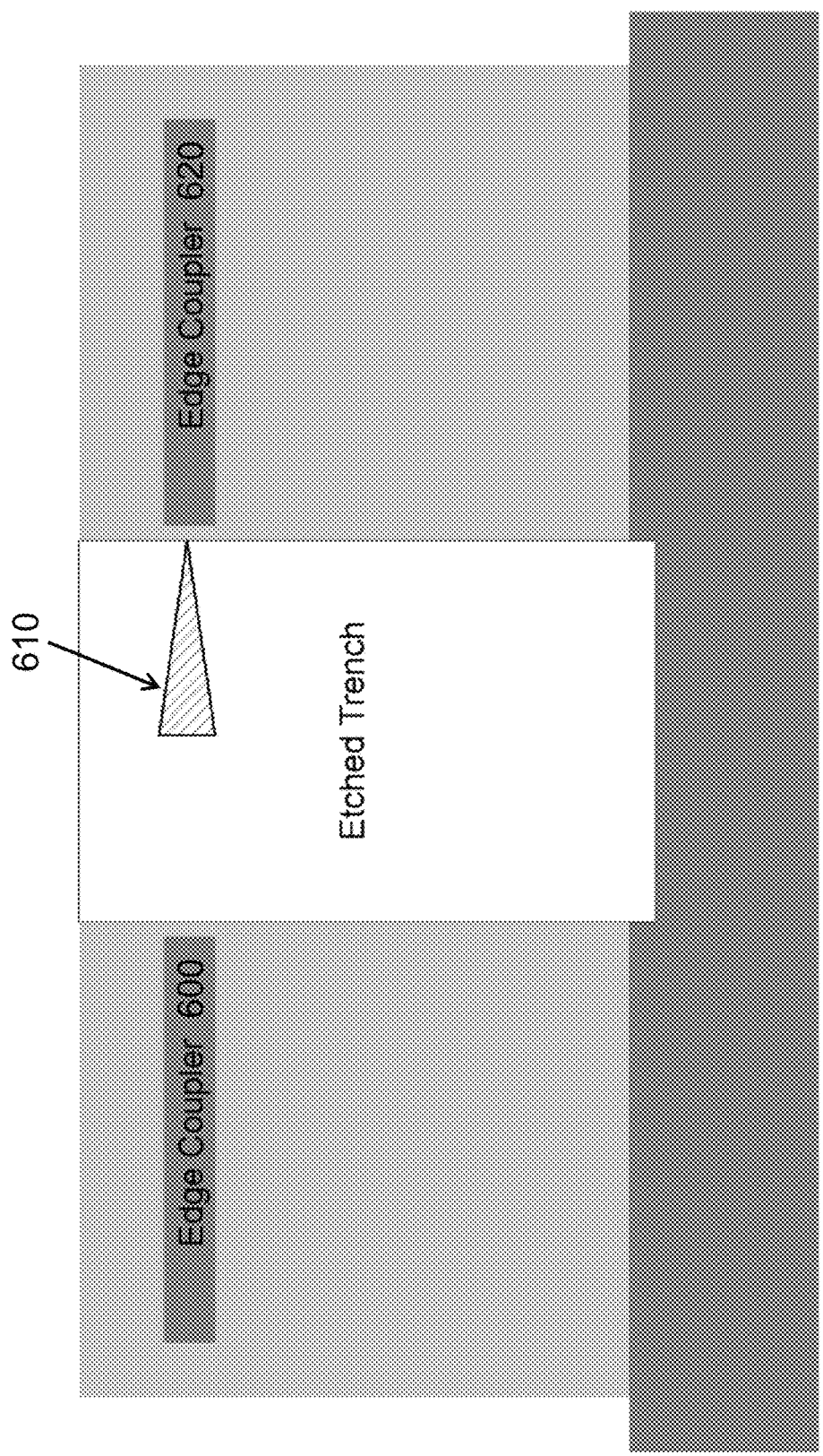
FIG. 6 is a cross sectional view through a second embodiment of a wafer having a plurality of chips fabricated thereon.

FIG. 6 is a cross sectional view through a second embodiment of a wafer having a plurality of chips fabricated thereon. In the embodiment of FIG. 6, an edge coupler 620 connected to a circuit on a chip (not shown) communicates with another edge coupler 600 as illustrated by the propagating light 610 that propagates across an etch trench.

Figure 7:
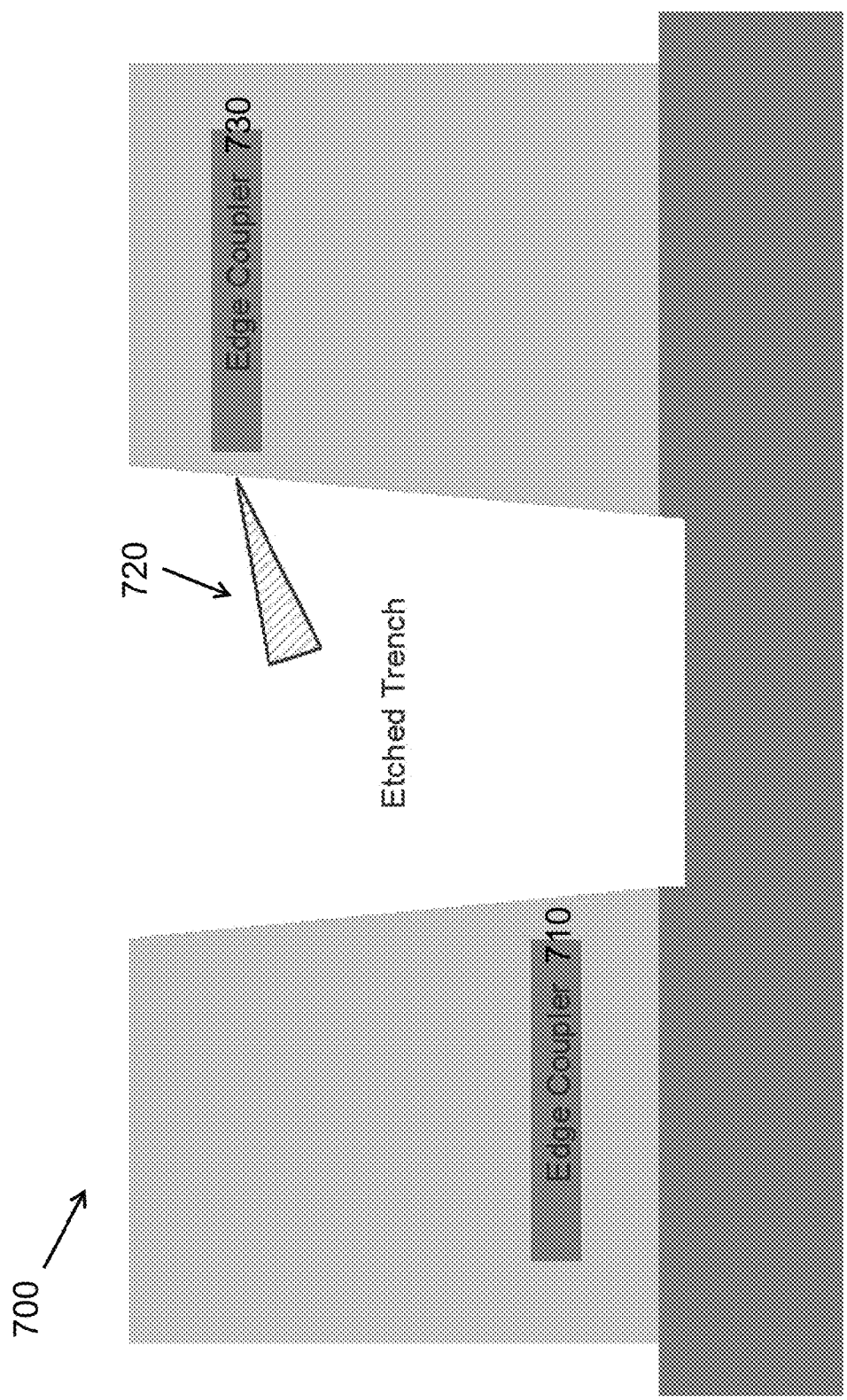
FIG. 7 is a cross sectional view through a third embodiment of a wafer having a plurality of chips fabricated thereon.

FIG. 7 is a cross sectional view through a third embodiment 700 of a wafer having a plurality of chips fabricated thereon. In the embodiment of FIG. 7, an edge coupler 730 connected to a circuit on a chip (not shown) communicates with another edge coupler 700 as illustrated by the propagating light 720 that propagates across an etch trench at an angle. Propagating light 720 is situated at an angle to a direction of propagation in edge coupler 730 in order to accommodate edge coupler 710, which is shown at a different height than edge coupler 730.

Figure 8:
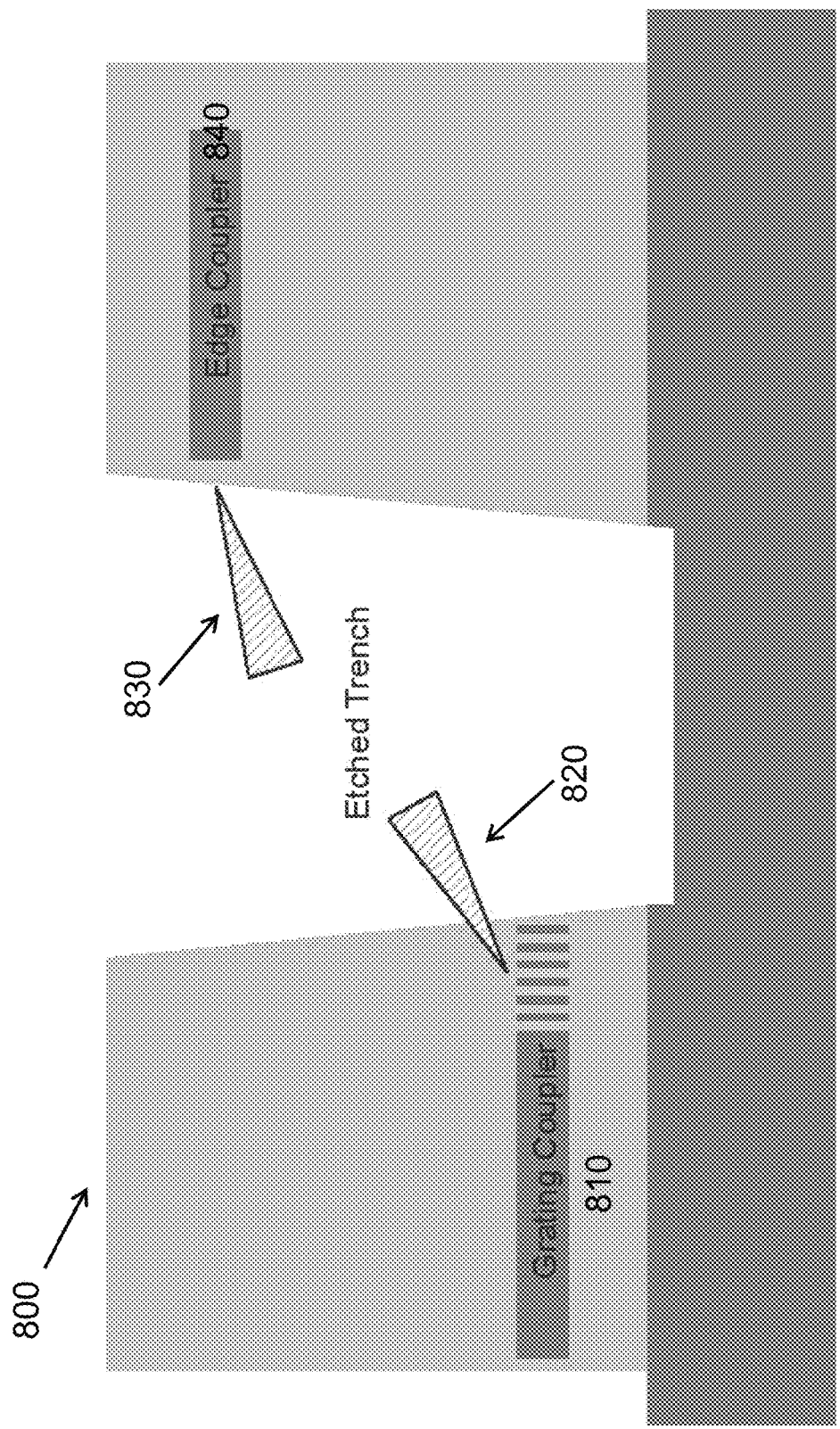
FIG. 8 is a cross sectional view through a fourth embodiment of a wafer having a plurality of chips fabricated thereon.

FIG. 8 is a cross sectional view through a fourth embodiment 800 of a wafer having a plurality of chips fabricated thereon. In the embodiment of FIG. 8, an edge coupler 840 connected to a circuit on a chip (not shown) communicates with a grating coupler 810 as illustrated by the propagating light 830 that propagates across an etch trench at an angle. Propagating light 830 is situated at an angle to a direction of propagation in edge coupler 840 in order to accommodate grating coupler 810, which is shown at a different height than edge coupler 840. Also shown is propagating light 820 from the grating coupler 810 to the edge coupler 840.

Figure 9:
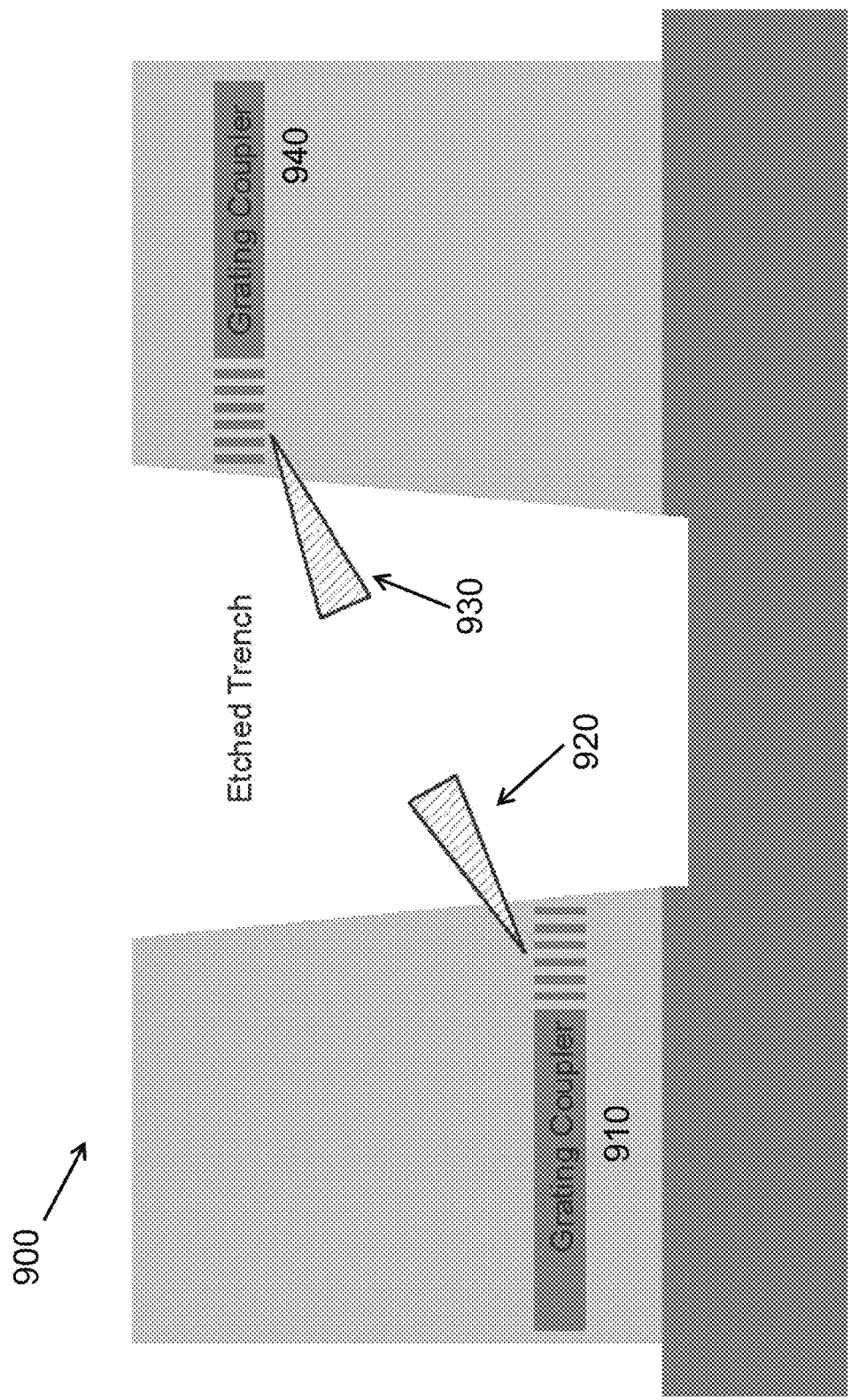
FIG. 9 is a cross sectional view through a fourth embodiment of a wafer having a plurality of chips fabricated thereon.

FIG. 9 is a cross sectional view through a fourth embodiment 900 of a wafer having a plurality of chips fabricated thereon. In the embodiment of FIG. 9, a first grating coupler 940 connected to a circuit on a chip (not shown) communicates with a second grating coupler 910 as illustrated by the propagating light 930 that propagates across an etch trench at an angle. Propagating light 930 is situated at an angle to a direction of propagation in grating coupler 940 in order to accommodate grating coupler 910, which is shown at a different height than grating coupler 940. Also shown is propagating light 920 from the grating coupler 910 to the grating coupler 940.

Various additional embodiments and features can be used with the systems and methods of the invention.

One can use on-chip photodiodes as monitors for edge couplers, using either taps or the structure shown in FIG. 1 and FIG. 2.

In some embodiments, one can use a plurality of coupler structures in sequence in order to characterize system losses.

In some embodiments, one can use couplers facing one another across a wafer-scale etched trench, in order to directly characterize coupling losses.

In some embodiments, grating coupled taps can be used to observe signals from an actual system such as a coherent transceiver, so as to allow testing of the actual edge facet that will be used and will be coupled to an optical fiber.

In some embodiments, one can provide lithographically designed in-plane lenses on one or two axes in combination with the chip.

In some embodiments, one may integrate polarization controllers and rotators with these structures.

In some embodiments, one may integrate additional electro-optical circuitry in the test structure to aid in the qualification of the chips, such as an on-chip phase modulator.

In some embodiments, one may integrate large photodiodes across the trench from the optical circuit's edge couplers, so as to monitor parameters such as insertion loss.

Design and Fabrication

Methods of designing and fabricating devices having elements similar to those described herein are described in one or more of U.S. Pat. Nos. 7,200,308, 7,339,724, 7,424, 192, 7,480,434, 7,643,714, 7,760,970, 7,894,696, 8,031,985, 8,067,724, 8,098,965, 8,203,115, 8,237,102, 8,258,476, 8,270,778, 8,280,211, 8,311,374, 8,340,486, 8,380,016, 8,390,922, 8,798,406, and 8,818,141, each of which documents is hereby incorporated by reference herein in its entirety.

Test Apparatus and Methods

Methods of testing photonic devices having elements similar to those described herein, and various kinds of test apparatus, are described in one or more of U.S. Pat. Nos. 7,200,308, 7,339,724, 7,424,192, 7,480,434, 7,643,714, 7,760,970, 7,894,696, 8,031,985, 8,067,724, 8,098,965, 8,203,115, 8,237,102, 8,258,476, 8,270,778, 8,280,211, 8,311,374, 8,340,486, 8,380,016, 8,390,922, 8,798,406, and 8,818,141, each of which documents is hereby incorporated by reference herein in its entirety.

DEFINITIONS

As used herein, the term "optical communication channel" is intended to denote a single optical channel, such as light that can carry information using a specific carrier wavelength in a wavelength division multiplexed (WDM) system.

As used herein, the term "optical carrier" is intended to denote a medium or a structure through which any number of optical signals including WDM signals can propagate, which by way of example can include gases such as air, a void such as a vacuum or extraterrestrial space, and structures such as optical fibers and optical waveguides.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A testing apparatus for a photonic chip on a substrate, comprising:
   a wafer having constructed thereon a plurality of photonic chips, each comprising a circuit including an operating port configured to be used during normal operation of the photonic chip after being disconnected from other photonic chips on the wafer;
   wherein at least one photonic chip from the plurality of photonic chips includes a test port configured to receive test light that propagates at a first angle to a free surface of said wafer, the test port configured to be used during a test of the at least one photonic chip or of an adjacent photonic chip which is conducted prior to the photonic chips being disconnected from each other and from other photonic chips on the wafer, wherein the operating port is separated from the test port by a trench having non-parallel walls, and wherein the test port and the operating port are disposed at different heights from the free surface of the wafer so as to optically couple the test port with the operating port across the trench with the non-parallel walls.

2. The testing apparatus of claim 1 further comprising a first edge coupler optically coupled to the test port, wherein the operating port comprises a second edge coupler, and wherein the first and second edge couplers are disposed at the different heights so as to cause the test light that propagates from the first edge coupler at the second angle to couple into the second edge coupler.

3. The testing apparatus of claim 2 wherein the first edge coupler and the second edge coupler each comprise a top surface and a bottom surface, wherein the bottom surface of each of the first edge coupler and the second edge coupler is farther from the free surface of the wafer than the top surface thereof, and wherein the top surface of one of the first edge coupler and the second edge coupler is disposed farther from the free surface of the wafer than the bottom surface of the other of the first edge coupler and the second edge coupler.

4. The testing apparatus of claim 1 further comprising a first grating coupler optically coupled to the test port, wherein the operating port comprises a second grating coupler, and wherein the first grating coupler and the second grating coupler are configured to be optically coupled across the trench with non-parallel walls.

5. The testing apparatus of claim 4 wherein the first grating coupler and the second grating coupler each comprise a top surface and a bottom surface, wherein the bottom surface of each of the first grating coupler and the second grating coupler is farther from the free surface of the wafer than the top surface thereof, and wherein the top surface of one of the first coupler and the second coupler is disposed farther from the free surface of the wafer than the bottom surface of the other of the first grating coupler and the grating second coupler.

6. The testing apparatus of claim 1 wherein the at least one photonic chip is configured so that the test port remains with the at least one photonic chip during normal operation thereof after the photonic chips are separated.

7. The testing apparatus of claim 1 wherein at least one of the test port and the operating port comprises a second grating coupler configured for optical coupling across the trench with non-parallel walls.

* * * * *